United States Patent [19]

Windele

[11] 4,174,176
[45] Nov. 13, 1979

[54] DEVICE FOR DETACHABLE ATTACHMENT OF A PRINT ORIGINAL TO A CYLINDER

[75] Inventor: Josef Windele, Puchheim, Fed. Rep. of Germany

[73] Assignee: Siemens Aktiengesellschaft, Berlin and Munich, Fed. Rep. of Germany

[21] Appl. No.: 841,800

[22] Filed: Oct. 13, 1977

[30] Foreign Application Priority Data

Apr. 19, 1977 [DE] Fed. Rep. of Germany ....... 7712225

[51] Int. Cl.² .................. G03B 27/10; B41F 1/28; B41F 21/00
[52] U.S. Cl. .................. 355/110; 101/415.1; 355/117; 358/291
[58] Field of Search .............. 355/104, 109, 110, 117; 101/415.1, 378, 385; 358/291

[56] References Cited

U.S. PATENT DOCUMENTS 3,151,554 10/1964 Townsend ............ 355/110 X

Primary Examiner—Richard A. Wintercorn
Attorney, Agent, or Firm—Hill, Van Santen, Steadman, Chiara & Simpson

[57] ABSTRACT

In the non-mechanical printing art relating to equipment for reproducing a negative on a photoelectric data carrier, a mechanical device for readily detachably applying a negative to a cylinder in such a manner as to assure flush application of the negative to the cylinder and proper positioning of the negative. The negative is provided with a spring contact strip at the leading edge and a knob contact strip at the trailing edge. The film is wrapped around the cylinder such that springs on the spring contact strip are caused to snap over knobs on the knob contact strip causing a tight wrapping of the film about the cylinder. The spring contact strip and the knob contact strip are positioned in proper registry with the film by the use of round and square locating markers and corresponding holes on the films and the strips respectively.

6 Claims, 3 Drawing Figures

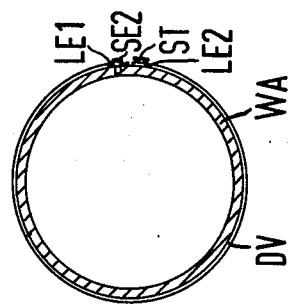
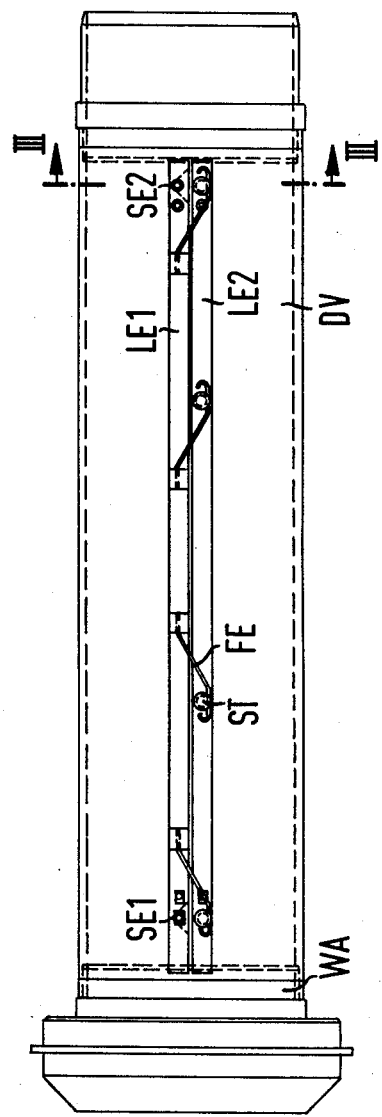

DEVICE FOR DETACHABLE ATTACHMENT OF A PRINT ORIGINAL TO A CYLINDER

BACKGROUND OF THE INVENTION

Field of the Invention

The field of art to which this invention pertains is non-mechanical printers and, in particular, to the art of reproducing a negative on a photoelectric data carrier and more particularly to applying a film to a cylinder in a flush, properly registered, readily detachable manner.

SUMMARY OF THE INVENTION

It is an important feature of the present invention to provide an improved means for attaching a print original to a cylinder for the purpose of reproducing the print original (negative) on a photoelectric data carrier in the non-mechanical printer art.

It is another feature of the present invention to provide a device by which a print original can be applied in a properly registered, readily detachable manner to a cylinder.

It is a further feature of the present invention to provide a device as described above wherein the print original is itself provided with a means to aid in its attachment to a cylinder and to cause that attachment to be in a properly registered, flush manner.

It is also a feature of the invention to provide a negative with a spring contact strip at a leading edge and a knob contact strip at a trailing edge wherein these strips are adhered directly to the negative, and the negative is wrapped about a cylinder such that springs associated with the spring contact strip are snapped over knobs associated with the knob contact strip.

It is another object of the invention to provide a negative of the type described above which is provided with circular and square markings at the edges thereof and wherein strips are applied to those edges in proper alignment by the use of respective circular and square openings which are used to locate the strips with respect to associated markings on the negative.

These and other objects, features and advantages of the invention will be understood in greater detail from the associated drawings and the following description wherein reference numerals are utilized to illustrate a preferred embodiment.

BRIEF DESCRIPTION OF THE DRAWINGS

FIG. 2 illustrates a cylinder with a print original attached.

FIG. 3 illustrates a section of the cylinder taken along the lines III—III of FIG. 2.

DESCRIPTION OF THE PREFERRED EMBODIMENT

Figure 1:
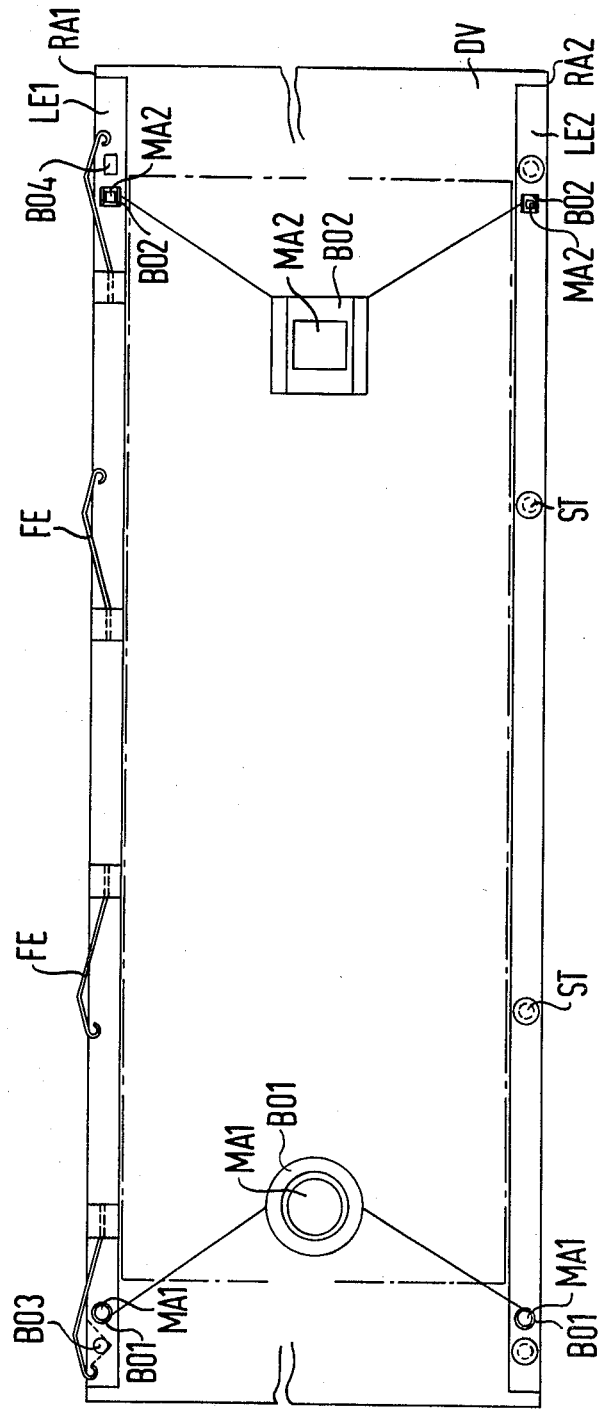
FIG. 1 is a print original with strips affixed to it.

The present invention relates to a device for the properly registered detachable application of a print original to a cylinder, and, particularly, for the application of a negative to a transparent cylinder for the purpose of reproducing the negative on a photoelectric data carrier in non-mechanical printers.

In printers operating on the electrostatic principle, it is well-known to produce form originals simultaneously with data printing. Such an arrangement is shown in U.S. patent application Ser. No. 783,544 where a form printer is used to produce these form originals. In such a printer, print originals, for instance, negatives, of the forms which are to be printed are applied to a transparent cylinder. The negatives can be produced at a scale of 1:1, and the transparent cylinder rotates synchronously with the photoelectric data carrier. Inside the cylinder a flourescent tube is arranged to illuminate the negative, and with the help of a diaphragm, sections of the negative are projected across an objective lens onto the photoelectric data carrier. A more detailed embodiment of this kind of form printer is disclosed in the above-mentioned U.S. Patent Application.

In the printing industry, various kinds of form originals are required to be produced in which case, it is necessary to apply a number of different print originals to a cylinder. The cylinder and the print originals must therefore be designed such that the originals can be attached to the cylinder in a simple, properly registered and readily detachable fashion. The print original must furthermore lie flush against the cylinder in order to achieve good, uniform print quality.

In this invention, the above goals are achieved by a spring contact strip which is arranged in properly registered fashion at the leading edge of the print original and by a knob contact strip with knob-like pins which is provided at the other edge of the print original. To attach the print original to the cylinder, one of the strips is assembled on pins carried by the cylinder, and the springs of the spring contact strip are engaged over the knob-like pins of the knob contact strip.

Firstly, respective strips are arranged on the print original, (e.g. adhered to it) at the leading and trailing edges. The two strips, namely the spring contact strip and the knob contact strip, must be located in proper register with respect to the print original. This can be achieved quite simply by providing the print original with circular and square marks, and by providing each strip with a circular hole having a diameter which is larger than the circular mark and, at the other end, with a rectangular hole having a larger size than the square mark. Before a strip is adhered to the print original, it is aligned so that the circular mark is centered in the circular hole, and the square mark likewise centered in the rectangular hole.

After the strips have been fastened to the print original, the original can be placed on the cylinder. The cylinder is provided with two pins parallel to its axis, and one of the strips, namely the spring contact strip, has two holes through which the pins on the cylinder can pass. Subsequently, the print original is wrapped around the cylinder and attached thereto by causing the springs of the spring contact strip to be engaged over the knob-like pins on the knob contact strip.

The springs can be wire springs which are fastened at one end in a cantilever manner to the spring contact strip, and which have free ends available to snap over the knob-like pins on the knob contact strip. It has been found convenient to provide four such wire springs on the spring contact strip, two of these having their free ends pointed towards one end of the strip, and the other two having their free ends pointed towards the other end thereof.

The invention has the advantage that the strips can be adhered quite simply and in proper registry with the print original. This can even be done by the customer. Furthermore, the application of the print original to the cylinder is readily detachable. Because of the spring attachment of the two strips, a flush application of the spring original against the cylinder is achieved, and this is not disturbed even should the cylinder expand or contract due to temperature variations.

Referring to the drawings in greater detail, FIG. 1 illustrates a print original DV which takes the form of a negative. This print original DV has two edges one of which is referred to as the leading edge RA1, and the other of which is the trailing edge RA2. At each edge, RA1 and RA2, a respective strip LE is arranged. The strip is designed as a spring contact strip LE1, and the other is designed as a knob contact strip LE2.

On the spring contact strip LE1 there are four springs FE. The springs FE can be designed as wire springs which are attached at one end to the spring contact strip LE1. The other end of each of the springs FE is left free.

The knob contact strip LE2 is provided with knob-like pins ST, the number of which is the same as the number of springs on the spring contact strip LE1.

In order to apply the strips LE in a properly registered fashion to the print original DV, a circular mark MA1 is applied at the edges RA of the original DV and also at one side thereof, while a square mark MA2 is applied at the other side in these same respective positions. The strips LE correspondingly contain a circular hole BO1 at one end, having a diameter which is larger than the diameter of the circular mark MA1. At the other end of the strip LE there is a rectangular hole BO2 whose size is larger than the size of the square mark MA2.

In order to arrange the strips LE in properly registered fashion with respect to the print original DV, the circular mark MA1 is centered in the hole BO1 of the strip LE. The position of the circular mark MA1 within the hole BO1 of the strip LE can be seen in FIG. 1. An enlarged illustration of this is shown to the left center of the figure. Secondly, the strip LE is so aligned that the square mark MA2 is located centrally in the opening BO2. The position of the mark MA2 inside the opening BO2 will be more readily apparent from the enlarged illustration shown to the right center of FIG. 1. When the marks MA are in position within the hole BO1S and BO2 in the manner indicated in FIG. 1, then the strips LE are properly disposed in relation to the print original DV and can be made to adhere to it. The properly registered alignment of the strips LE with respect to the print original DV can be achieved without recourse to additional aids, simply by following the above indicated steps.

The application of the spring original to a cylinder WA has been shown in FIGS. 2 and 3. The cylinder WA is provided with two pins SE1 and SE2. This may, for example, be the spring contact strip LE1. The latter contains holes BO3 and BO4 corresponding to the pins SE1 and SE2 carried by the cylinder WA. The pins SE1 and SE2 pass through the holes BO3 and BO4, and then the print original DV is wrapped around the cylinder WA until the strip LE2, the knob contact strip, reaches the spring contact strip LE1. The springs FE are then snapped onto the knob-like pins ST. FIG. 2 illustrates a situation in which the springs FE have been snapped into position about the pins ST.

In this way, a spring connection is established between the spring contact strip LE1 and the knob contact strip LE2. This achieves the result that the print original DV rests flush against the cylinder WA and remains undisturbed even due to temperature caused variations in the cylinder WA.

If the spring original DV is to be removed from the cylinder WA, then it is merely necessary to detach the springs FE from the knob-like pins ST. Subsequently, the print original DV can be unwrapped from the cylinder WA, and the strip LE1 lifted off the pins SE1 and SE2.

It will be apparent that various modifications of this embodiment can be effected without departing from the scope of the invention, and all such modifications as come within the following claims are intended to be included as my invention.

I claim:

1. A device for removably attaching a negative to a cylinder comprising:

means for attaching spring clips along one longitudinal edge of the negative, means for attaching locking knobs along the other longitudinal edge of the negative, said locking knobs being generally aligned with corresponding ones of said spring clips, and said spring clips being engagable over said locking pins when said negative is rolled in the form of a cylinder, said means for attaching said spring clips being a spring contact strip, said spring contact strip being an elongated strip of material having a plurality of spring clips secured at spaced intervals along the length thereof, said means for attaching said locking knobs being a knob contact strip in the form of an elongated strip of material with a plurality of knobs secured at like spaced intervals along the length thereof, the negative having a first pair of marks located in the vicinity of a first longitudinal end of the negative and adjacent to the longitudinal edges thereof, said negative having a second pair of marks located at the opposite longitudinal end in the vicinity of the longitudinal edges, each of the contact strips having openings which conform in configuration to said respective marks but which are larger in size, said contact strips being caused to overlie the region of said marks such that said holes align with the correspondingly configured marks on the negative, whereby said contact strips are properly positioned on the negative.

2. A device in accordance with claim 1 wherein said spring clips comprise cantilever-type springs having one end fixed to the spring contact strip and the other end being free to snap over the knobs located on the knob contact strip.

3. A device in accordance with claim 1 wherein said spring contact strip and said knob contact strip are adhered directly to the longitudinal edges of said negative.

4. A device in accordance with claim 1 wherein four spring clips are provided on said spring contact strip and four knobs are provided on the knob contact strip, said spring clips being symmetrically positioned with respect to the center of said spring contact strip.

5. A device in accordance with claim 4 wherein the spring clips comprise wire springs having one end fixed to the spring contact strip and the other end free in cantilever manner, free ends of two of the wire springs being directed oppositely of the free ends of the other two of the wire springs.

6. A device in accordance with claim 1 wherein one of the two contact strips is provided with at least two additional holes for receiving projections from a cylinder upon which the negative is to be mounted, whereby said contact strip having said holes may be mounted on a pair of pins on a cylinder and the negative may be wrapped about the cylinder and fastened upon itself with the spring clips snapping over said knobs.

* * * * *